OSCILLATOR UTILIZING AVALANCHE BREAKDOWN
OF SUPERCOOLED SEMICONDUCTOR

Filed June 4, 1958 2 Sheets-Sheet 1

*INVENTORS*
SEYMOUR H. KOENIG
GERARD R. GUNTHER-MOHR
BY Alvin J Riddles
ATTORNEY United States Patent Office
3,011,133
Patented Nov. 28, 1961

3,011,133

OSCILLATOR UTILIZING AVALANCHE BREAKDOWN OF SUPERCOOLED SEMICONDUCTOR

Seymour H. Koenig, Rockville Center, and Gerard R. Gunther-Mohr, Wappingers Falls, N.Y., assignors to International Business Machines Corporation, New York, N.Y., a corporation of New York Filed June 4, 1958, Ser. No. 739,855
7 Claims. (Cl. 331—107)

This invention relates to solid state circuit elements and in particular to solid state circuit elements operated at low temperatures.

The use of the physical characteristics of materials in the solid state to influence the flow of electrical energy has been developing for a long period of time. The early investigations of these physical properties were performed in the last century, and examples of the practical applications of some of these properties in circuit elements have appeared in the early part of this century in the development of the radio industry. Some of the better known of these elements have been crystal rectifiers, transducers, resonators, and detectors. There have been studies of the nature of many materials conducted, but, with the discovery of transistor action, the door was opened to make outstanding headway in the understanding and the utilizing of the physical properties of semiconductor materials, and, in the past decade, a wide variety of solid state semiconductor circuit elements for example, transistors, diodes, photoconductors, electroluminescent cells and thermistors have appeared, each utilizing one or more of the physical characteristics of semiconductor materials to achieve the desired control of electrical energy that is the identifying feature of the device.

It has been discovered that a solid state material may be given new and unique physical characteristics not heretofore exhibited, by a combination of the control of the ingredients in the material and the environmental conditions under which it is to operate, whereby, a resulting new solid state circuit element may be fabricated which is capable of response to electrical energy influence that is different from the type of response heretofore associated in the art with either conductors, non-conductors, or semiconductors and is capable of performing electrical energy control in a wide variety of circuit applications.

It is an object of this invention to provide a new solid state circuit element.

It is another object of this invention to provide a new solid state circuit element material.

It is another object of this invention to provide a solid state circuit control element having either negligible or significant conduction under the influence of external energy.

It is a related object of this invention to provide a solid state bilateral voltage limiter device.

It is a related object of this invention to provide a solid state voltage regulator device.

It is another related object of this invention to provide a solid state magnetic field sensing element.

It is another related object of this invention to provide a solid state negative resistance element.

It is another related object of this invention to provide a solid state oscillator circuit.

Other objects of the invention will be pointed out in the following description and claims and illustrated in the accompanying drawings, which disclose, by way of example, the principle of the invention and the best mode, which has been contemplated, of applying that principle.

These and other objects are achieved in accordance with the invention by providing a crystalline material as a circuit element in a condition wherein essentially all of the carriers are confined to a lower, essentially non-conducting level, energy state and carriers in controllable quantities may be confined or released from this state to the conduction energy level of the material through the application of an external force to the material. The force may be magnetic, electrical or thermal. This material then, subject to external control, will have negligible conductance in one condition and significant conductance in another condition so that it may serve as a new type of circuit element.

Figure 1:
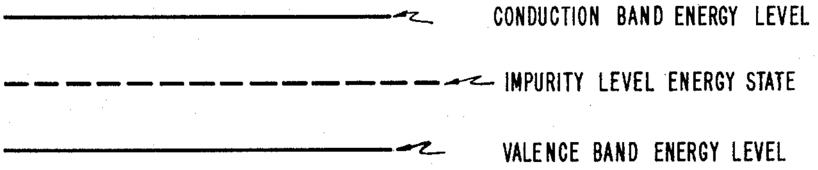
FIGS. 1, 2 and 3 are the band energy diagrams of types of materials capable of performance in accordance with the invention.

Materials have been classified as being conductors, non-conductors or semiconductors according to their electrical performance. The mechanism by which the performance of these materials has been explained is that the individual atom of each material when arranged in a crystalline solid has an energy band structure such that, in the case of a conductor material, many electrons are present in the conduction band, even at absolute zero temperature, in the case of the non-conductor the separation between the valence band and the conduction band is so large that very few carriers are present in the conduction band, and, in the case of the semiconductor, the separation between the valence band and the conduction band is sufficiently small that appropriate impurities or imperfections may be inserted into the material to bring the energy level separations for the electrons within limits that are subject to external control. The activation energy of a material may be defined as the energy required to raise an electrol from a stable essentially non-conducting energy state to the conduction band.

It has also been found that a crystalline material may, through the combined effects of control of the concentration of impurity centers in the material and the maintaining of the thermal energy in the material within particular limits, be capable of exhibiting an activation energy within a range of values such that the energy may be supplied by an external force of an electrical, magnetic or thermal nature.

A typical material satisfying the criteria of this invention is germanium in crystalline form having essentially all valence bonds satisfied wherein the concentration of conductivity type determining impurity centers, for example of arsenic or antimony, is therein maintained in the vicinity of $10^{17}$ atoms per cubic centimeter and the temperature of operation is maintained at a temperature including or lower than the liquid nitrogen range.

The following theory is advanced for the mechanism by which the material of this invention is capable of exhibiting its unique electrical characteristics, it being understood that the following explanation is provided only to aid in understanding and practicing the invention.

The theory is illustrated in order to aid in understanding the invention and is applied to examples of materials capable of satisfying the criteria of the invention.

It is established in the art that there is a certain maximum concentration of impurity centers in a material beyond which there is no measurable activation energy value for the material. This value varies widely and has been established for example to be in the vicinity of $5 \times 10^{17}$ impurity centers per cubic centimeter of material for arsenic and antimony in germanium. The effect of impurity center concentration on the activation energy is described in an article entitled: "Electrical Properties of N-type Germanium," by P. Debye and E. Conwell, Physical Review, vol. 93, No. 4, pages 693–706, Feb. 15, 1954.

Further, in solid state materials of this type there is a temperature range above which so many carriers have sufficient thermal energy that they are in the conduction band. This temperature range in our particular example of germanium has been found to be approximately 10 degrees Kelvin for relatively pure material with conductivity type determining impurities of Group V of the periodic table and approximately 50 degrees Kelvin for relatively impure materials with Group V impurities. It will be apparent that for other material and impurity combinations, the temperature range will vary according to the magnitude of the activation energy in the particular case.

In order to more clearly comprehend the mechanism by which solid state materials satisfy the criteria of the material of this invention, consider as examples the following:

*Example A*

Germanium has an energy band separation of approximately 0.7 electron volt. Through the introduction of impurity centers, the separation between the conduction band and a stable essentially non-conducting energy level may be reduced by introducing impurity centers which set up an energy state intermediate between the valence band energy level and the conduction band energy level. The separation between these levels is the activation energy of the germanium. When the concentration of the impurity centers reaches a critical value, which is on the order of a few times $10^{17}$ atoms per cubic centimeter, the activation energy required for electrical conduction disappears. The germanium having an impurity center concentration of less than a few times $10^{17}$ atoms per cubic centimeter when maintained in the range of liquid helium or about 4 degrees Kelvin will have essentially all of the electrons in the essentially non-conducting impurity energy levels and will have essentially no carriers in the conduction band. The energy band level structure of germanium may be seen in connection with FIGURE 1. In this figure the separation between the valence band energy level and the conduction band energy level of 0.7 electron volt for pure germanium is shown. An intermediate stable energy level has been set up through the introduction of impurity centers and this level has been labelled impurity level energy state and is shown dotted in FIGURE 1. The separation between the impurity level energy state and the conduction band is the activation energy for the germanium having the impurity centers present in it. The impurity level energy state broadens toward the conduction band according to the type of impurity added and the concentration until at approximately a value in the range of a few times $10^{17}$ atoms per cubic centimeter, the impurity level energy state in effect overlaps the conduction band and no activation energy is apparent. When germanium is maintained in the vicinity of 4 degrees Kelvin essentially all of the carriers are confined to the impurity level energy state and electrical conduction by the material is controllable by an applied force. As previously described, the force may be magnetic, electrical or thermal and its function is to activate the carriers. The conduction that takes place in the material increases with increasing electric fields and temperature and is reduced by the magnetic fields. Thus germanium is an example of a material having a fairly wide band energy separation, which, when the impurity center concentration and temperature are held within the criteria limits, will serve as an electrical conductor in controllable response to thermal, electric or magnetic force.

*Example B*

Figure 2:
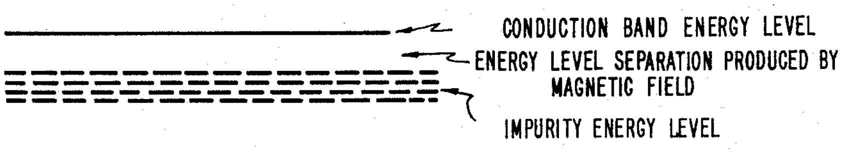

N-type indium antimonide (InSb) has, under ordinary conditions, no measurable impurity activation energy, but, an energy level separation may be imparted to it by placing it in the influence of a magnetic field. The effect of this imparted separation then is that carriers must be activated to the conduction band. Hence this material in the influence of a magnetic field may be employed for purposes of this invention. In N-type (InSb) there is no apparent activation energy for impurity concentrations greater than about $10^{14}$ atoms per cubic centimeter, however, a strong magnetic field will induce an energy separation. It should be pointed out that P-type InSb is similar to the behavior pattern of germanium. The energy band structure of materials of the type of N-type (InSb) may be seen in connection with FIGURE 2. In this figure the conduction band energy level is shown by a heavy solid line and the impurity energy levels are shown by the dotted lines. The conduction in this material under these conditions increases with increasing electric fields and temperature and varies with magnetic field strength. Thus indium antimonide (InSb) serves as an example of a material whose conduction can be activated through the influence of external means and which when the impurity center concentration and thermal energy criteria are met will perform in accordance with the invention.

Figure 3:
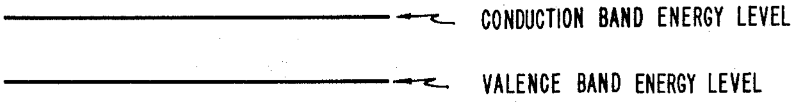

In addition to the above, there are a class of elements wherein the separation between the valence and conduction bands is sufficiently small that an external force can initiate conduction in them. The band energy diagram for such elements is shown in FIGURE 3 wherein the valence band energy level is shown separated from the conduction band by a distance which corresponds to an activation energy magnitude that could be supplied by an external force.

The material, in accordance with this invention has a variety of practical applications, wherein its electrical conduction is either negligible or appreciable in response to applied energy, is employed to achieve performance not heretofore available in the art. In order to aid in understanding and practicing the invention, the following group of examples of practical applications are provided.

The material of this invention may be employed as a voltage limiter whereby an electric field produced by the voltage to be controlled is impressed across a sample of material and wherein the electric field resulting from the voltage imparts sufficient energy to the structure of the material to cause conduction to take place.

Figure 4:
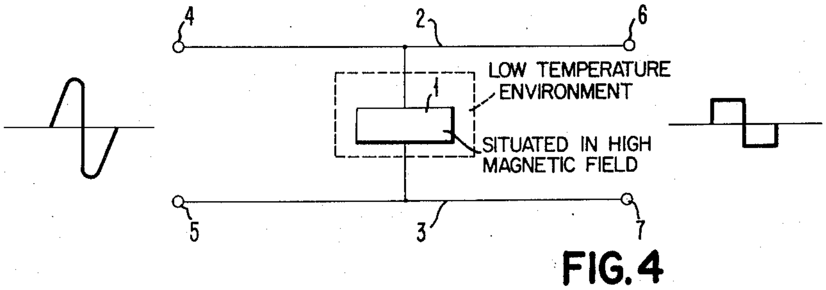
FIG. 4 is an illustration of a bilateral voltage limiter constructed in accordance with this invention.

Referring now to FIGURE 4, an example circuit is provided showing a quantity 1 of the material of this invention connected between two conductors labelled 2 and 3. Input terminals 4 and 5 are provided to receive the impressed voltage and output terminals 6 and 7 are available at which the limited voltage may be sensed. An alternating input signal is shown as a sine wave impressed at terminals 4 and 5 and a bi-lateral limited output waveshape is shown as a square wave between terminals 6 and 7. It will be apparent that the amplitude of the output at each side of reference is determined by the particular material and its dimensions, employed as element 1.

Figure 5:
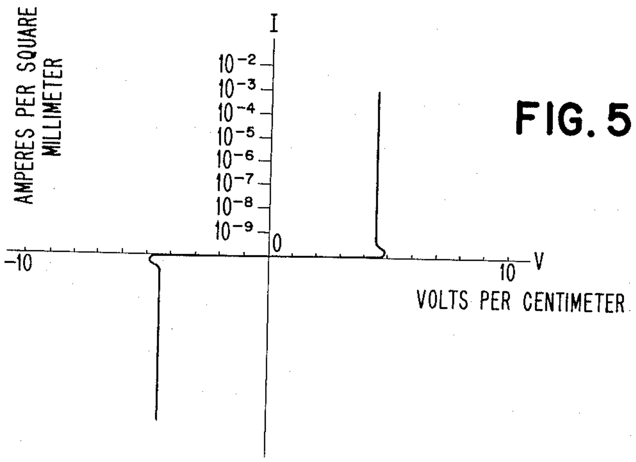
FIG. 5 is an illustration of the current-voltage response characteristic curve of the material of this invention.

Referring to FIGURE 5, a current-voltage characteristic curve of the material 1 of the circuit of FIGURE 4 is shown wherein, on both sides of the origin, essentially no current flows until a voltage is impressed which produces an electric field in material which is sufficient to supply the activation energy for the material 1, at which time the material exhibits what is known as constant voltage characteristics. This will be seen by the fact that the curve at the critical voltage becomes essentially parallel to the current axis. It will be apparent to one skilled in the art that the material 1 exhibiting this characteristic may be readily employed for voltage regulation purposes wherein only one quadrant of the curve of FIGURE 5 is employed. Should the material be made of the class of materials described in connection with FIGURE 2 in which indium antimonide is a member, the material 1 of FIGURE 4 will be operated in the presence of a magnetic field not shown.

The material of this invention exhibits electrical conductivity changes that vary with an increase in the magnetic field applied thereto.

Figure 6:
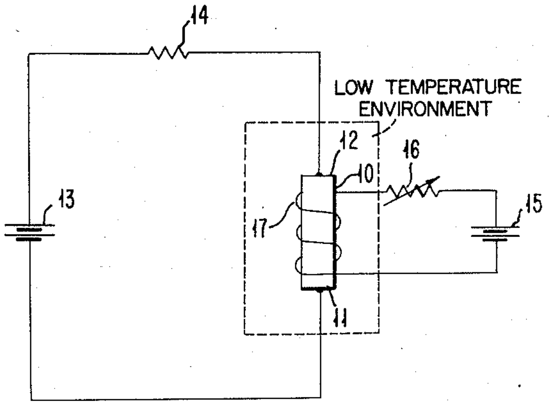
FIG. 6 is an illustration of a magnetic field responsive device constructed in accordance with this invention.

Referring now to FIGURE 6, a schematic embodiment of a magnetic field sensitive circuit employing the material of this invention is shown. The circuit includes a body 10 of the above-described material which may be described as a crystalline material having an activation energy of a magnitude sufficient for control by an external activation energy supply, a density of impurity centers sufficiently low so as not to mask the effect of the activation energy and operated at a temperature sufficiently low that essentially all of the carriers in the material are confined to the lower energy state. The material 10 is made up with two ohmic contacts 11 and 12, respectively, which are positioned in separated relationship on the body 10. Current is provided through the body 10 from a battery 13. Current flows from the battery 13 through contact 11 and contact 12 through a load 14 in series. A magnetic field is applied schematically to the body 10 by a battery 15, a winding 17 positioned around the body and a variable resistor 16 connected in series. In the embodiment of FIGURE 6, the material 10 changes in conductivity inversely with application of a magnitude of the magnetic field produced by a variation in the magnitude of resistor 16. As will be appreciated by one skilled in the art, the equipment providing the magnetic field which was chosen to illustrate the physical properties of magnetic field sensitivity of the material 10, the battery 15, resistor 16, and winding 17 in series may be replaced by an existing magnetic field, and the magnitude of such field may be sensed through the use of the material of this invention, and hence the piece of equipment is operable as a magnetic field sensitive device. It will also be apparent that should the material 10 be made of one of the classes of material such as indium antimonide, as illustrated in connection with FIGURE 2, a steady state magnetic field will be applied such as through appropriate adjustment of the resistor 16 in FIGURE 6 which imparts the energy level separation to the material and then the changes in total magnetic field produced by superimposing the effect of a second magnetic field on the material 10 inversely effects conductivity.

In operation, a force is applied to the element 10 by the battery 13 sufficient to provide activation and cause conduction through the element 10. The magnitude of the energy required to initiate conduction in element 10 will be greater in the presence of magnetic fields. This may be seen by referring to FIGURE 7 wherein the response curve of the material to magnetic fields is shown.

Figures 7, 8, 9:
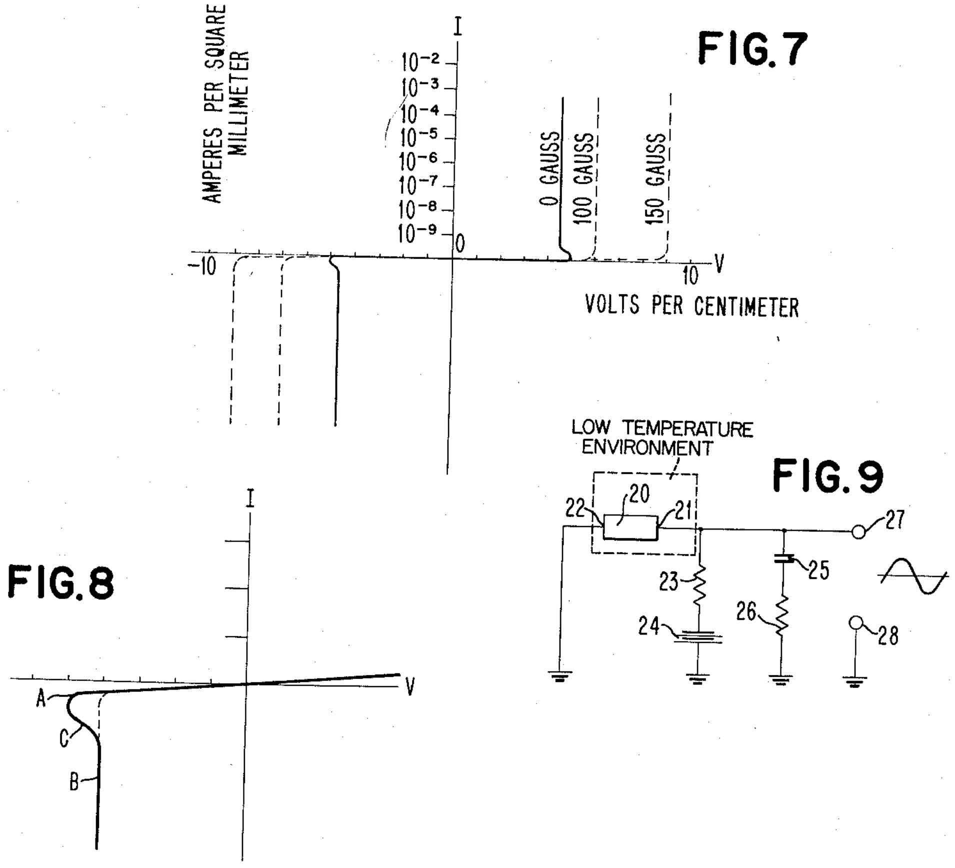
FIG. 7 is an illustration of a current-voltage characteristic curve of the material of this invention illustrating the magnetic field response.
FIG. 8 is an illustration of a negative resistance region in the current-voltage characteristic of the material of this invention.
FIG. 9 is an oscillator constructed in accordance with this invention.

Referring now to FIGURE 7, a current-voltage characteristic is shown for the material 10 in the circuit illustrated in FIGURE 6. The zero magnetic field characteristics of the material 10 of FIGURE 6 is indicated by the solid line. Increases in magnetic field are indicated by dotted lines which operate to decrease the effect of an electric field or thermal force on the material and hence to confine the carriers to the lower energy state so that the resulting effect is that conduction through the sample decreases with an increase in the magnitude of the magnetic field. This may be seen in FIGURE 7 by the fact that a greater voltage and hence electric field is required to initiate conduction when a greater magnetic field is present. The magnitude of the effect illustrated in FIGURE 7 is affected by the sample purity. The illustration is for high purity materials. It will be clear that materials of the type of FIGURE 2 will exhibit conductivity changes in response to magnetic fields but there is no critical voltage that must be exceeded.

The material of this invention exhibits a region of negative resistance at the transition to constant voltage operation of the characteristic curve between the essentially non-conducing and conducting state. This point of negative resistance has been illustrated by a small curve in FIGURES 5 and 7 and is magnified to provide a better illustration in FIGURE 8.

Referring now to FIGURE 8, a current-voltage characteristic of an expanded scale is shown where a body of the material of this invention has two soldered contacts thereto. As may be seen from the curve of FIGURE 8 as the electric field which results from the application of a voltage between the two contacts to the material increases there is little appreciable change in magnitude of current through the material until a breakdown voltage labelled A is reached, at which point, dependent on the activation energy of the material, conduction is initiated therein and the material enters a constant voltage region labelled B which is at a value of field lower than that at the breakdown value A. This may be described as a negative resistance region between the two portions of the curve. As is well known in the art, the manifestations of a negative resistance region in the output characteristic of an electrical component is the basis for the fabrication of devices having the property of a plurality of stable states, since, due to the inherent shape of a negative resistance type characteristic curve, it is possible to construct a load line for the device which will intersect the curve at more than one point. An illustration of a use of this negative resistance may be seen in connection with FIGURE 9.

Referring now to FIGURE 9, the circuit of an oscillator is shown wherein a body 20 of the material of this invention is provided with soldered contacts 20 and 22. Contact 22 is connected to ground and contact 21 is connected through a load resistance 23 to the negative terminal of a battery 24 having its positive terminal connected to ground. A capacitor 25 and a resistor 26 in series are connected between terminal 21 and ground. Output terminals 27 and 28 are provided for signal sensing purposes well known in the art.

The oscillator in FIGURE 9 when battery 24 is connected operates in the following manner. The current from battery 24 charges capacitor 25 and as the charge raises the potential across the element 20, a point is reached at point A in FIGURE 8, at which time the material of element 20 breaks down through the negative resistance region C to the constant voltage region B of the curve in FIGURE 7. At point B, the capacitor 25 discharges through the material of element 20 so that the curve follows the dotted region in FIGURE 8 to a value less than A. This operates to remove the activation energy and return the material 20 to a high impedance condition. The battery 24 then again charges capacitor 25 until the potential across the material 20 reaches the breakdown voltage A. The oscillation of the circuit of FIGURE 9 occurs between points A and B of the curve of FIGURE 8 and may be sensed between terminals 27 and 28.

What has been described is a solid state material having negligible electrical conduction in one condition and appreciable and useful conduction in another condition wherein the controlling condition is the presence of a force of either thermal, electric, or magnetic nature. The material is an element or compound in a crystalline state having the concentration of impurity centers and the presence of thermal energy sufficiently low so as not to mask the presence of an activation energy for electrical conduction for the material. A number of illustrations of practical applications of the material have been shown, each selected to illustrate the particular electrical response of the material to an external influence.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. A solid state oscillator comprising a body of crystalline material operated at a temperature wherein essentially all of the carriers are confined to an energy state lower than the conduction band energy state, at least first and second soldered contacts to separate areas of said body, means connecting said first contact to a reference potential, a power source having one terminal thereof connected to a reference potential, a load impedance having a first terminal thereof connected to the remaining terminal of said power source, and having the second terminal thereof connected to said second soldered contact of said body of material, a capacitor having one terminal thereof connected to said second soldered contact to said body of material, a resistor having one terminal thereof connected to the remaining terminal of said capacitor and having the remaining terminal thereof connected to said reference potential, and, signal sensing means connected between said reference potential and said second soldered contact on said body of material.

2. The solid state oscillator of claim 1 wherein said body of material is monocrystalline germanium semiconductor material having an arsenic conductivity type determining impurity density in the range of $10^{17}$ per cubic centimeter and operated at a temperature in or lower then the liquid nitrogen temperature range.

3. A solid state circuit element having a negligible electrical conduction in one condition and an appreciable and useful conduction in another condition, comprising crystalline N conductivity type indium antimonide, magnetic field means operable to impart an impurity activation energy gap to said indium antimonide and said body being operated at a temperature wherein essentially all of the thermally generated carriers are confined to an energy state lower than that of the conduction band energy level, whereby without said magnetic field means metallic conduction exists and with said magnetic field means metallic conduction is replaced by semiconductor type conduction.

4. A solid state circuit element comprising a quantity of crystalline N conductivity type indium antimonide, magnetic field means operable to impart an impurity activation energy gap to said indium antimonide, at least first and second contacts to said indium antimonide in an environment capable of confining the temperature to a value sufficiently low that essentially all of the thermally generated carriers are confined to an energy level that is lower than that of the conduction band energy level, whereby without said magnetic field means metallic conduction exists and with said magnetic field means metallic conduction is replaced by semiconductive type conduction.

5. A solid state circuit element comprising a body of crystalline N conductivity type indium antimonide, a magnetic force capable of imparting an activation energy gap to said indium antimonide and an environment capable of maintaining the temperature sufficiently low that essentially all of the thermally generated carriers are confined to an energy level lower than the conduction band energy level, whereby without said magnetic force metallic conduction exists and with said magnetic force metallic conduction is replaced by semiconductive type conduction.

6. A voltage regulating circuit comprising a body of crystalline N conductivity type indium antimonide, magnetic field means operable to impart an impurity activation energy gap to said indium antimonide, means maintaining said indium antimonide at a temperature sufficiently low that essentially all thermally generated carriers are confined to an energy level lower than the conduction band energy level, at least first and second contacts made to said body at separate positions thereon, first and second signal transmission lines between which a voltage to be regulated appears, means connecting said first contact on said body to said first signal line and means connecting said second contact on said body to said second signal line, whereby metallic conduction through said body exists without said magnetic field and with said magnetic field said metallic conduction is replaced by non-linear semiconductor type conduction operable to regulate said voltage.

7. The voltage limiting circuit of claim 6 wherein said body of monocrystalline indium antimonide has a conductivity type determining impurity center concentration in a range of $10^{17}$ and is operated at a temperature less than 50° K.

References Cited in the file of this patent

UNITED STATES PATENTS

| | | |
|---|---|---|
| 2,666,884 | Ericsson et al. | Jan. 19, 1954 |
| 2,725,474 | Ericsson et al. | Nov. 29, 1955 |
| 2,736,858 | Welker | Feb. 28, 1956 |
| 2,752,434 | Dunlap | June 26, 1956 |
| 2,752,553 | Dunlap | June 26, 1956 |

OTHER REFERENCES

Sclar et al.: Impact Ionization of Impurties in Germanium, J. Phys. Chem. Solids, vol. 2, pp. 1–23, March 1957.